(12) United States Patent
Overweg

(10) Patent No.: US 11,404,191 B2
(45) Date of Patent: Aug. 2, 2022

(54) SUPERCONDUCTING MAGNET ASSEMBLY

(71) Applicant: KONINKLIJKE PHILIPS N.V., Eindhoven (NL)

(72) Inventor: Johannes Adrianus Overweg, Eindhoven (NL)

(73) Assignee: Koninklijke Philips N.V., Einhoven (NL)

( * ) Notice: Subject to any disclaimer, the term of this patent is extended or adjusted under 35 U.S.C. 154(b) by 131 days.

(21) Appl. No.: 16/762,359

(22) PCT Filed: Oct. 29, 2018

(86) PCT No.: PCT/EP2018/079527
§ 371 (c)(1),
(2) Date: May 7, 2020

(87) PCT Pub. No.: WO2019/096567
PCT Pub. Date: May 23, 2019

(65) Prior Publication Data
US 2020/0273611 A1 Aug. 27, 2020

(30) Foreign Application Priority Data
Nov. 14, 2017 (EP) ..................... 17201479

(51) Int. Cl.
*H01F 6/06* (2006.01)
*G01R 33/3815* (2006.01)
*H01F 6/00* (2006.01)

(52) U.S. Cl.
CPC ........... *H01F 6/06* (2013.01); *G01R 33/3815* (2013.01); *H01F 6/008* (2013.01)

(58) Field of Classification Search
CPC ........ H01F 6/06; H01F 6/008; G01R 33/3815
See application file for complete search history.

(56) References Cited

U.S. PATENT DOCUMENTS

| 3,559,128 A * | 1/1971 | Kingston ................ H01F 6/065 335/216 |
| 4,943,792 A | 7/1990 | Srivastava et al. |

(Continued)

FOREIGN PATENT DOCUMENTS

| JP | 07115016 A | 5/1995 |
| JP | 2004179413 A | 6/2004 |
| JP | 2009130336 A | 6/2009 |

OTHER PUBLICATIONS

International Search Report and Written Opinion from PCT/EP2018/079527 dated Jun. 18, 2019.

*Primary Examiner* — G. M. A Hyder

(57) ABSTRACT

A superconducting magnet arrangement comprises a field coil assembly with coil windings that when in operation are electrically superconducting. The field coil assembly is circuited between connection ports for a voltage supply. A switching module switches a sub-section of the field coil assembly's coil windings between its electrical superconducting and electrical resistive states, said sub-section forming a switching coil circuited between the connection ports. In the operational state where both the switching coil and the field coil(s) are superconducting and carry a permanent electrical current, the field coil(s) and the switching coil together generate a stationary magnetic field. According to the invention the switch windings give a significant contribution to the magnetic field. The field coil assembly's coil windings that may be switched between it electrically superconducting and resistive states form the switching coil. That is, the switching coil forms part of the field coil assembly and contributes significantly to the magnetic field generated by the field coil assembly.

20 Claims, 4 Drawing Sheets

(56) References Cited

U.S. PATENT DOCUMENTS

| | | |
|---|---|---|
| 6,014,069 A | 1/2000 | Havens et al. |
| 10,746,826 B2 | 8/2020 | Liu |
| 2010/0245005 A1* | 9/2010 | Takahashi ............... H01L 39/02 |
| | | 335/216 |
| 2013/0109574 A1 | 5/2013 | Stautner |
| 2015/0045226 A1 | 2/2015 | Overweg et al. |
| 2015/0346299 A1 | 12/2015 | Pourrahimi |
| 2016/0308110 A1 | 10/2016 | Tanaka et al. |
| 2017/0097397 A1* | 4/2017 | Jonas ................ G01R 33/3802 |

* cited by examiner

SUPERCONDUCTING MAGNET ASSEMBLY

CROSS REFERENCE TO RELATED APPLICATIONS

This application is a U.S. national phase application of International Application No. PCT/EP2018/079527 filed on Oct. 29, 2018, which claims the benefit of EP Application Serial No. 17201479.7 filed on Nov. 14, 2017 and is incorporated herein by reference.

FIELD OF THE INVENTION

The invention pertains to a superconducting magnet arrangement comprising a field coil assembly with coil windings that when in operation are electrically superconducting and operated in persistent mode. Notably, the invention pertains to a superconducting magnet for a magnetic resonance examination system.

BACKGROUND OF THE INVENTION

Persistent mode operation of superconducting magnets is explained by M. Wilson in section 11.2 of his book Superconducting Magnets (Oxford University Press, 1983, ISBN 0-19-854805-2).

Persistent mode operation of superconducting magnets is achieved by connecting a superconducting switch in series with the superconducting field-generating coils. This switch consists of a length of superconducting wire wound on a support structure in such a way that it does not contribute to the field of the magnet. In persistent operation, it carries the full magnet electrical current. Heating the switch to a temperature above the superconducting transition temperature causes the switch to become resistive. A power supply connected in parallel to the switch can then be used to change the electrical current in the field generating coils.

SUMMARY OF THE INVENTION

An object of the present invention is to provide a superconducting magnet that is less expensive to manufacture.

This object is achieved according to the invention by a superconducting magnet arrangement comprising
- a field coil assembly with coil windings that when in operation are electrically superconducting,
- the field coil assembly being circuited between connection ports for a voltage supply
- and a switching module to switch a sub-section of the field coil assembly's coil windings between its electrical superconducting and electrical resistive states, said sub-section forming a switching coil circuited between the connection ports.

The operation of the magnet arrangement of the invention is similar to persistent mode operation as described by Wilson, with the exception that the function of superconducting switch is performed by field generating coil sections or coil windings that can be heated. The main differences from prior art operation are caused by the fact that the prior art superconducting switch does not generate any significant field and does not have any significant inductance whereas the switching coil does contribute to the magnet's field and does have a significant inductance. The sub-section of the field coil assembly's coil windings that may be switched between its electrical superconducting and electrical resistive states forms a switching coil.

The field of the magnet arrangement of the invention can be ramped-up by setting the switching coil to its resistive state and connecting an electric power source across the switching coil. An optionally detachable power supply may be connected to the connection ports to apply a voltage across the switching coil(s). The power supply may be arranged to supply an electrical current at positive or negative voltages across the connection ports.

Application of a voltage across the connection ports causes the electrical current in the superconducting part of the magnet circuit to increase at a rate proportional to the voltage. The warm, i.e. resistive, switching coil is not carrying significant electrical current. When the electrical current through the field coil(s) has reached its pre-set end-value, the voltage across the connection port is set to zero, the switching coil is set to its superconductive state and the electrical current supplied by the power supply is ramped-down to zero. When the switching coil is in its superconducting state, it forms a fully superconducting closed loop with the other field generating coils, in which a persistent electrical current can circulate. As the electrical current from the power supply is reduced to zero the electrical current in the switching coil increases, until the final state is reached where all coils, i.e. the field coils including the switching coil of the magnet carry the same electrical current. In this final state the circulating electrical current in the magnet circuit will generally be lower than at the time when the switching coil was made superconducting. In order to obtain the desired final electrical current, the maximum electrical current at the end of the ramp has to be set somewhat higher. After the electrical current from the power supply has been reduced to zero, the power source can be thermally and electrically disconnected. Disconnecting the power supply leads can be done using relay-switches. In the operational state where both the switching coil and the field coil(s) are superconducting and carry a permanent electrical current, the field coil(s) and the switching coil together generate a stationary magnetic field. According to the invention these switch windings give a significant contribution to the magnetic field. In other words, according to the invention the field coil assembly's coil windings that may be switched between its electrically superconducting and resistive states form the switching coil. Or, the switching coil forms part of the field coil assembly and contributes significantly to the magnetic field generated by the field coil assembly.

The switching coil may be an assembly of several switching coils, connected in series. The concept works best if approximately 5-10% of the magnet's wire forms the switching coil(s). This length can be one or several complete coil sections of an MRI magnet. Alternatively it can be just a part of a single full winding section. Keeping the configuration of switching and non-switching coil(s) in the magnet system mirror-symmetric with respect to the z=0 mid-plane is preferred, because this allows existing quench detection and protection methods to be used.

Apart from the change in magnet electrical current during ramp-down of the external power supply, the procedure of bringing the magnet to field and putting it into persistent mode is identical to ramping up a conventional persistent mode magnet, as described by Wilson.

Preferably, the switching coil(s) and the field coil(s) are geometrically arranged and have respective numbers of windings, so that the stationary magnetic field is spatially homogeneous. This renders the superconducting magnet system suitable for use in a magnetic resonance examination system.

The switching module to switch the switching coil (assembly) between its electrical resistive and superconducting states can be embodied as a switchable heater to adjust the temperature of the windings of the switching coil(s) between values below and above its superconducting critical temperature, respectively. Alternatively a local radio frequency electromagnetic field to the switching coil(s) may be applied to change the switching coil(s) from its superconducting state to its electrically resistive state. In addition to activating the heater, it is advantageous to inhibit the active cooling of the coil section(s) to be switched, to prevent overloading the cooling system of the magnet. The switching coil(s) may be sufficiently thermally isolated from the other coils that it can be made non-superconducting without risk of quenching the other field coil(s). For this reason this concept is most suitable to be used in magnets where the superconducting coils are located in a vacuum space and cooled by a refrigeration system.

The present invention enables to ramp-up and down the superconducting magnet arrangement without the need of a separate persistent current switch. Hence, there is no need to take steps to avoid any field of the persistent electrical current switch to perturb the stationary magnetic field. Rather, the invention enables for the switching coil(s) to add to the field strength and homogeneity of the stationary magnetic field and/or contribute to actively shield the environment from the stray field of the magnet. That is, the switching coil(s) and the field coil(s) operate together to generate the stationary magnetic field. The main benefit of using a field generating coil as the switching element is that it becomes possible to achieve a high resistive-state resistance of the switching element at comparatively low cost. The dissipation during a ramp is equal to the square of the ramping voltage divided by this open state resistance; e.g. in order to limit this dissipation to less than 1 W, this resistance is of the order of 100Ω for typical ramp voltages of up to 10V. The open resistance of the switching coil is directly proportional to the length of wire in the switch. A conventional persistent electrical current switch formed as a separate circuit element not generating field, would need a long switch wire length which just adds cost. An additional benefit of using coil wire for the switching function is that no special switch wire with a high-resistivity matrix is required to achieve a high normal-state resistance. The switching coil(s) can be wound from standard pure copper stabilized conductor, which improves the stability of the magnet in normal operation and reduces the risk of a spontaneous quench.

The ramping up procedure may be executed in reverse order to ramp down the magnet. After connection of the external power supply, its electrical current has to be ramped up to reduce the electrical current in the switching coil(s) to a value close to zero. Then the switching coil(s) is made non-superconducting and after this the external electrical current is slowly reduced to zero. This requires a voltage across the connection ports (terminals) of the magnet opposing the electrical current flow. This negative voltage can be achieved by connecting a dissipating element (resistor, diode) in series with the power supply or by bypassing the power supply with a diode and then interrupting the electrical current through the power supply. Many embodiments of such a two-quadrant power supply are known per se and any of such power supplies used on conventional MRI magnets will be suitable for a magnet assembly of the invention that makes use of the switch concept based on the switching coil(s).

If the external power supply cannot be switched on to reduce the electrical current in the switching coil(s) to zero (for example in case of an electric (mains) power failure) it is possible to connect a dump resistor or diode and activate the heater in the switching coil(s) (with battery-supplied back-up power). This may quench the switching coil but if its energy content is small enough that this event does not cause a full quench of the remaining coil sections, the system magnet will automatically enter its discharge state and the electrical current will decrease to zero.

These and other aspects of the invention will be further elaborated with reference to the embodiments defined in the dependent Claims.

In a preferred embodiment of the superconducting magnet arrangement of the invention, the self-inductance of the switching coil(s) is much less than the inductance of the field coil(s) assembly. Preferably, the ratio of the inductance of the switching coil(s) to the inductance of the field coil assembly in in the range of 1/20 to 1/2, preferably in the range of (0.08 to 0.12) and very good results are achieved at a ratio of 1/10. This achieves to limit re-distribution of electrical current at the end of the ramp-up and ensures that a relatively small overshoot of the electrical current to the magnet coils is needed.

Preferably, the switching coil(s)'s ohmic resistance in its resistive state is above a minimum value of about 10Ω, which results in low losses during ramp-up or down. To elaborate in more detail, if the magnet is ramped, there is a voltage of e.g. 10 Vs across the connection ports. The electrical current in the field coil(s) increases about proportionally to the applied voltage and inversely proportional to the field coils' self-inductance. Thus, the higher the voltage, the faster the ramp will be. The applied voltage also causes some electrical current through the non-superconducting switching coil(s). This electrical current is proportional to the applied voltage and inversely proportional to the normal state resistance of the switching coil(s). The dissipation in the switching coil(s) due to this electrical current is quadratic with the applied voltage and inversely proportional to its normal state resistance. Hence a low dissipation in the switching coil(s) requires a normal state resistance of somewhere between 10 and 100 Ohm (otherwise the ramp voltage has to me made very low, which may result in ramping times of many hours).

The field coil(s) are mounted onto or held in position by a support structure, which may also carry the switching coil(s). The switching coil(s) can be one or more individual coil sections of a multi-section MRI magnet. They can be part of the set of inner coils generating the internal magnetic field or of the set of shielding coils, which actively cancel the magnet's stray field, or both. It is also possible that the windings of the switching coil(s) are in close proximity to other field generating windings. For example, the outermost winding layers of one or more coil sections can be used as switching coils. According to an aspect of the invention a thermal isolation is provided between the switching coil(s) and the other field coils of the MRI magnet to have then remain superconducting. This achieves that, when the switching coil(s) is warmed to increase its temperature above its superconducting critical temperature, there is no or only a low amount of heat transferred to the field coil(s) so that no higher cooling capacity of the field coil(s) is needed to keep the field coil(s) windings superconducting. In case the coils are cooled by means of circulating fluid helium, either liquid or gaseous, it may be advantageous to reduce or interrupt the helium flow towards the switching coil during the time when the coil needs to be in its resistive state. Thus the energy deposition in the magnet's cooling system is minimized during magnet ramping.

In another aspect of the invention, the field coil(s) and the switching coil(s) are geometrically aligned coaxially along a common longitudinal axis while field coil(s) windings as well as the switching coil(s) windings are azimuthally around the longitudinal axis. The field coil(s) and the switching coil(s) may be in parallel radially (transversely to the longitudinal axis) extending planes. Each of the field coil(s) and the switching coil(s) may have different or equal radial sizes and numbers of windings in accordance with the field strength and spatial distribution of the stationary magnetic field. In general, the coil winding techniques used for standard field generating coils can also be used for the switching coil(s).

In another aspect of the invention, the field coil assembly's field coils and the switching coil(s) include windings of a high-temperature superconducting material having its critical temperature in the range of 20-80K. This allows for a higher operating temperature of the superconducting magnet assembly. At higher temperatures cooling mechanisms are more efficient to keep the temperature of the field coil(s) and the switching coil(s) below the superconducting critical temperature. A suitable high-temperature material is MgB2 having its superconducting critical temperature at 39K (at zero magnetic field). Such higher temperature superconductors tend to be significantly more expensive than conventional Niobium Titanium conductors; eliminating the need for superconducting wire in a conventional switch where it does not contribute to the field generation may therefore be particularly attractive.

In a further aspect of the invention the switching coil may comprise a length of MgB2-superconducting wire in the range of 1600-2400 m. This wire may be produced through the powder-in-tube (PIT) ex situ and in situ processes. This amount of material is according to the invention, in operation, contributing to the stationary magnetic field. These and other aspects of the invention will be elucidated with reference to the embodiments described hereinafter and with reference to the accompanying drawing wherein

DETAILED DESCRIPTION OF THE EMBODIMENTS

Figure 1:
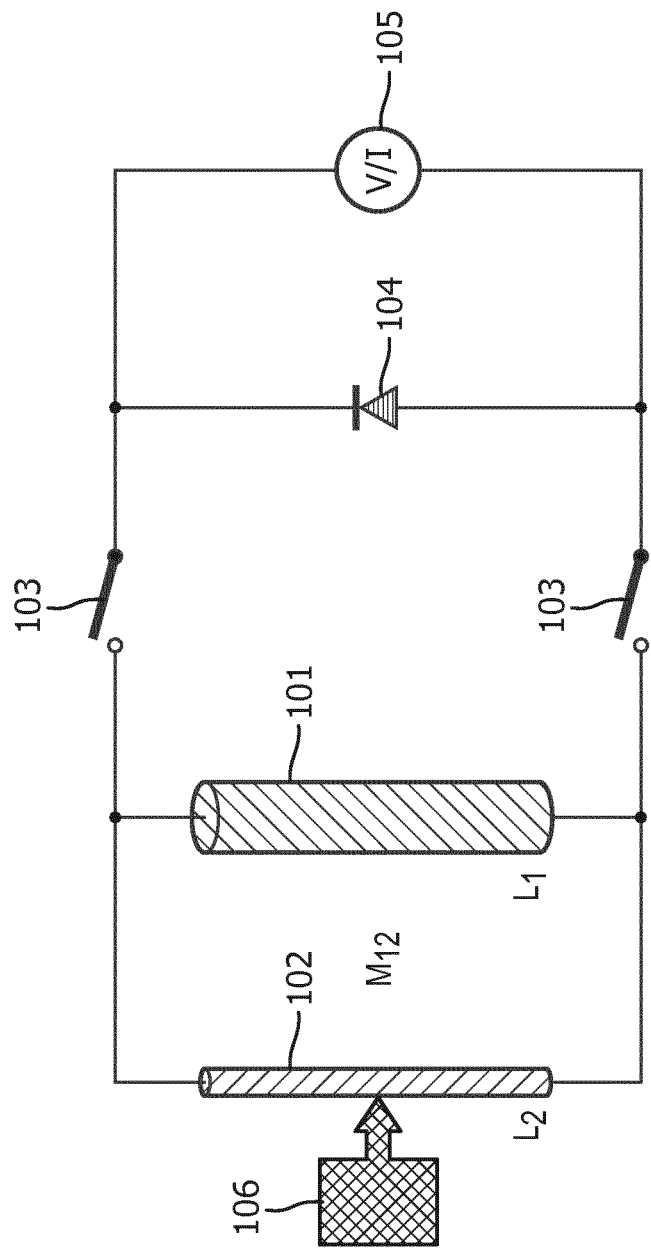
FIG. 1 is an electric circuit diagram of an example of the superconducting magnet assembly according to an embodiment with the power supply coupled to it.

FIG. 1 is an electric circuit diagram of an example of the superconducting magnet assembly 100 of the invention with a power supply 105 coupled to it. The field coil 101 of self-inductance L1 is for simplicity shown here as a single unit, but in practice is arranged as an assembly of several field coils. The switching coil 102 of self-inductance L2 is shown as a single unit, but in practice the switching coil 102 may be arranged as an assembly of several switching coil(s). The switching coil 102 and the field coil 101 together form a superconducting loop closed in itself. There is no need for the coil sections forming the switching coil 102 to be physically grouped together in the magnet assembly 100, where the interconnecting wiring of the coil sections has to be such that all sections of the switching coil 102 are connected directly in series, without elements of the non-switching category in between.

A controllable power supply 105 is connected across the switching coil 102 by means of electrically and thermally detachable current leads that include current lead switches 103, which may be remotely operated relays. The field coil 101 and the switching coil 102 may be cooled to superconducting temperature by a cryogenic system (not shown). It is advantageous to provide a means to increase the thermal resistance and/or reduce the refrigeration power for the switching coil 102 during the time it has to be in the resistive state. The controllable power supply 105 is connected to the current lead switches 103. A diode or stack of diodes 104 may be circuited in parallel to the power supply 105 to allow electrical current from the magnet assembly 100 to circulate even when the power supply 105 is in its switched off state.

The invention is employed according to the following procedure. To achieve that the superconducting magnet assembly generates the specified magnetic field, the current lead switches 103 are closed, the field coil 101 is cooled so that it is superconducting and the switching coil 102 is arranged to be in its resistive state. To that end an adjustable heater 106 is provided to dissipate heat into the switching coil 102 to increase its temperature above the superconductive critical temperature. Optionally, the cooling of the switching coil 102 is reduced or interrupted. A DC voltage $V_0$ is generated by the power supply 105, which causes an increasing electrical current through the superconducting field coils 101. This electrical current continues to increase until, after a time tramp it reaches is pre-set value $I_{set}$ at which the voltage from the power supply 105 is reduced to zero. During the ramp, the voltage across the resistive switching coil 102 causes an electrical current $V_0/R_{switch}$ through this coil, which causes a dissipation $V_0^2/R_{switch}$. Because of this ramp-related dissipation, the power of the heater 106 can be in order to limit the total amount of heat accumulated in the switching coil 102. After reaching the current set point, the switching coil 102 is made superconducting, e.g. by switching off the heater 106 and enabling the cooling of the switching coil 102. The required wait time for the switching coil 102 to become superconducting is equal to ratio of the amount of energy dissipated in the switching coil 102 during the ramp, which is equal to $(L_1 \cdot I_{set})^2/t_{ramp} \cdot R_{switch}$, and the cooling capacity of the refrigeration system of the switching coil 102. Note that neither the mass nor the volume of the switching coil 102 influence the required wait time. Using a relatively large coil as a switch is advantageous because this results in a large resistance $R_{switch}$. After the switching coil 102 has reached its superconducting state, the electrical current from the power supply 105 is reduced to zero. This causes the electrical current in the switching coil 102 to increase. Simultaneously, there is a reduction in the electrical current in the field coil 101. In the final state, the electrical currents in all coils 101 and 102 become equal and there is no longer a electrical current flowing to the power supply 105. The power supply 105 may then be safely disconnected. The field coil 101 and switching coil 102 are in series carrying equal electrical current and both contribute to the magnetic field of the superconducting magnet.

The proper value for the electrical current set point $I_{set}$ at the end of the ramp up which is needed for a final electrical current $I_0$ can easily be calculated using the values of the inductances of the field coils 101 $L_1$ and of the switching coil 102 $L_2$ and the mutual inductance between these two coils $M_{12}$. As soon as the switching coil 102 reaches its superconducting state the total magnetic flux in the superconducting magnet circuit including the coils 101-102 becomes entrapped and remains constant for as long as the circuit is superconducting. At the end of the ramp, this entrapped flux is equal to $L_1 \cdot I_{set}$ whereas in the final state it is equal to $L_{total} I_0$. Here $I_{total}$ is the total inductance of the superconducting loop, which is equal to $L_1 + L_2 + 2M_{12}$. Therefore, the current set point has to be $I_{set} = I_0 \cdot (L_{total}/L_1)$. Since the inductances are very well known, either by simulation or by measurement, the required current overshoot is accurately predictable. The above formula also shows that as long as $L_2$ and $M_{12}$ are much smaller than $L_1$ the magnitude of the required current overshoot is limited.

For the magnet to ramp down, the current lead switches 103 are closed, the power supply 105 is switched on and its electrical current is ramped up such that the electrical current in the switching coil 102 is reduced to a small value. Then the heater 106 is switched on to raise the temperature of the switching coil 102 above its superconducting critical temperature. The field coil 101 remains superconducting. Applying a negative voltage across the field coils 101 then causes the electrical current to reduce to zero.

Figure 2A:
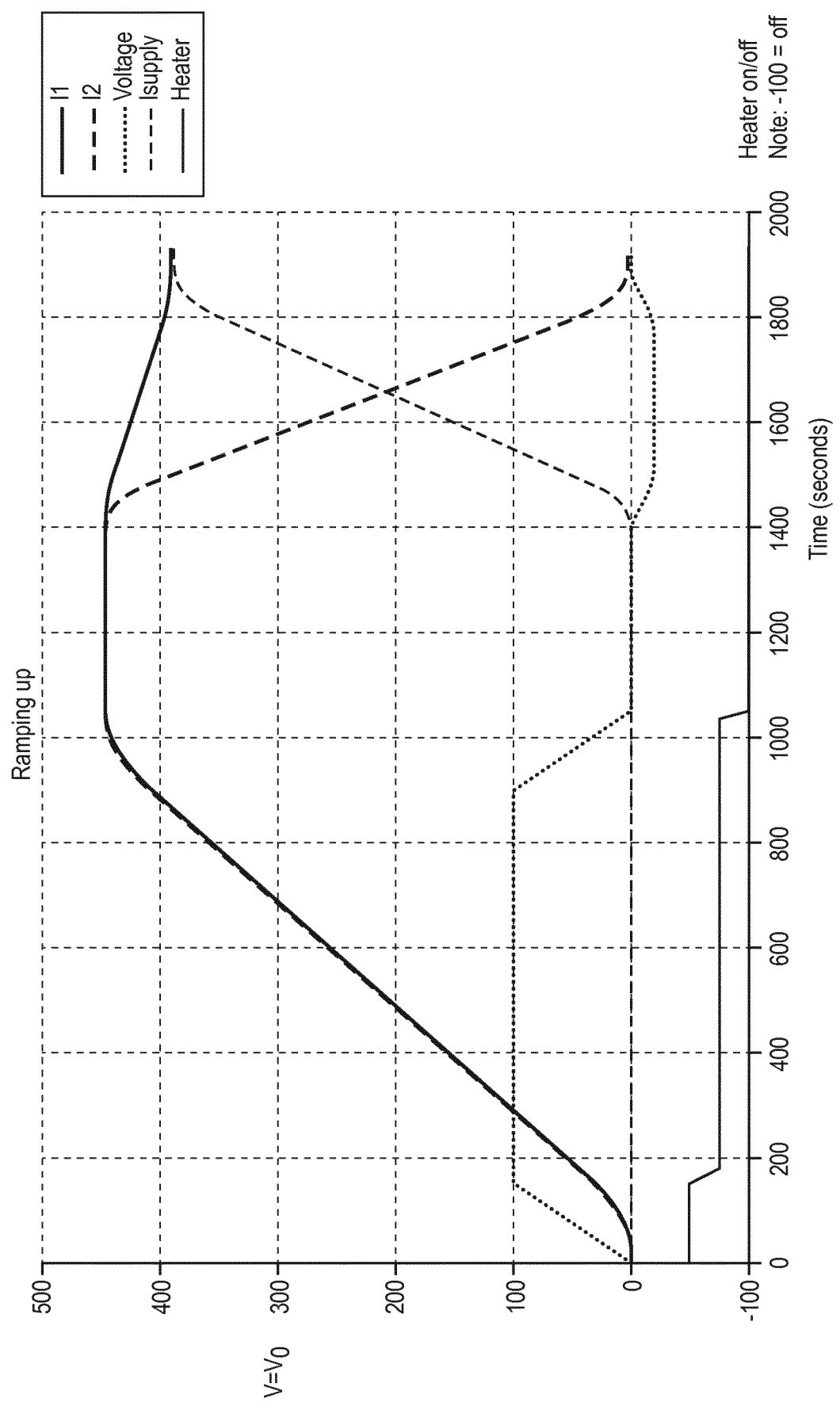
FIGS. 2a and 2b are graphical representations of the dynamics of the electrical quantities during the ramp-up and ramp-down procedures, respectively, of the super conducting magnet assembly according to an embodiment.

FIG. 2a is a graphical representation of the dynamics of the electrical quantities during the ramp-up procedure of a typical example of the superconducting magnet assembly of the invention, with a field coil inductance $L_1 = 20$ H, a switching coil inductance $L_2 = 2$ H, a mutual inductance $M_{12} = 0.1$ H. At the start of the ramp-up at $t=0$, the heater 106 is on, so that the switching coil 102 is in its resistive state. The dashed line represents the voltage supplied by the power supply 105. After an initial transient, the voltage is kept at a constant value $V_0$. The drawn curve shows the electrical current through the field coil 101. The electrical current increases approximately linear with time at a rate $V_0/L_1$. At time point $t_1$ the electrical current through $L_1$ reaches its set point $I_{set}$ and the voltage of the power supply 105 is set to zero. Then, while the electrical current through the field coil 101 remains at its constant level $I_{set}$, the heater 106 of the switching coil 102 is switched off and the normal cooling of this coil is re-activated. The system has to be kept in this state until the switching coil 102 has become superconducting. After sufficient waiting time to allow the switching coil 102 to become fully superconducting, the electrical current from the power supply 105 is ramped to zero. This causes an increase of the electrical current in the switching coil 102 and a decrease of the electrical current in the field coils 101, until the two electrical currents have become equal and the electrical current flowing to the power supply 105 has become zero. During the redistribution of the electrical current, a negative inductive voltage is generated, which is associated with the decrease of the energy in the field coils 101 and switching coils 102 due the re-distribution of the electrical current.

Figure 2B:
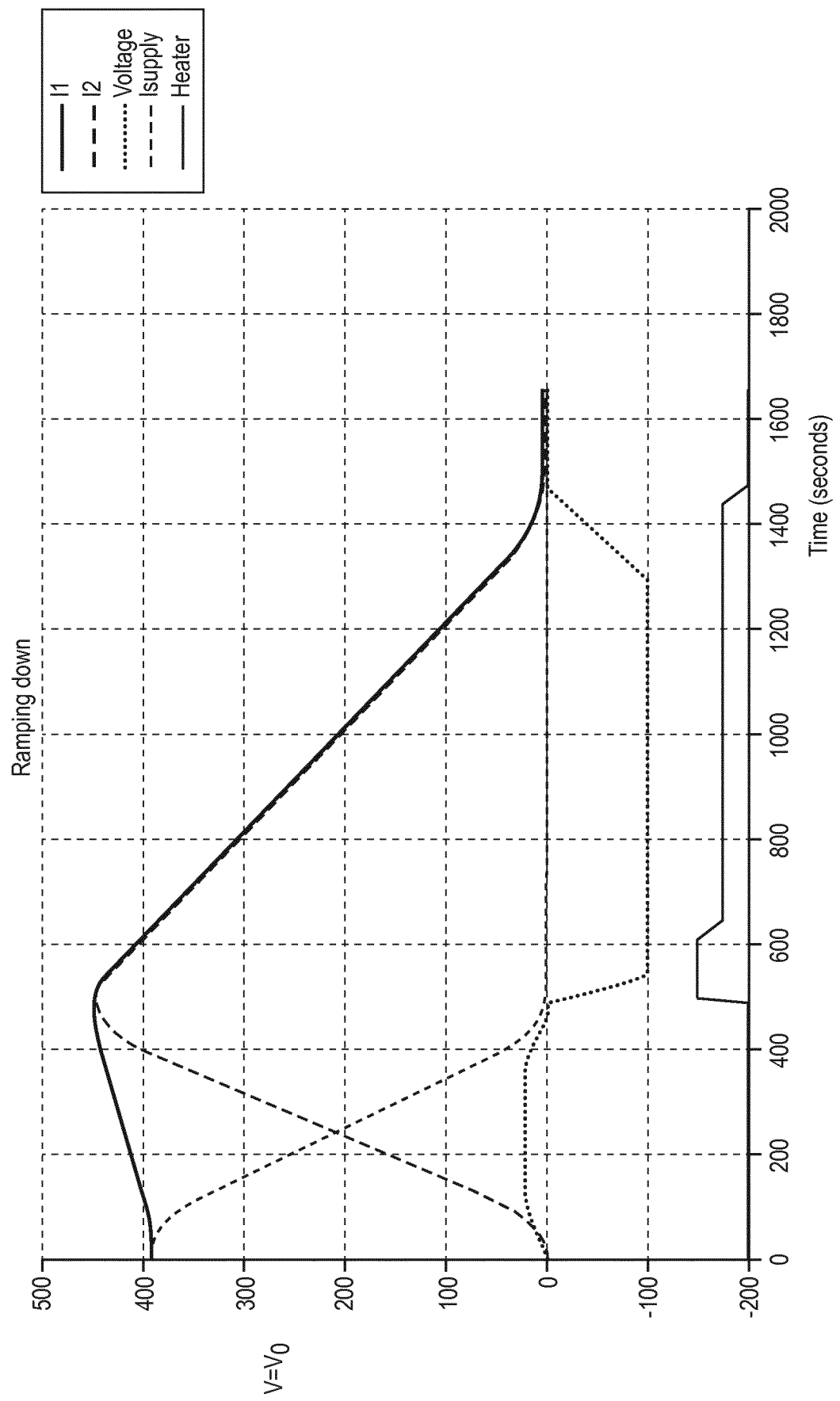

FIG. 2b is a graphical representation of the dynamics of the electrical quantities during a controlled ramp-down of a typical magnet according to the invention. First a positive voltage is applied to the magnet, which causes the electrical current in the switching coil 102 to decrease. Simultaneously, the electrical current in the field coils 101 increases. When the electrical current from the power supply has reached the value $I_{set}$ previously used during the ramp up, the electrical current in the switching coil 102 has become zero. At this point, the heater 106 of the switching coil 102 can be switched on and optionally the cooling of the switching coil 102 can be reduced or disabled. Applying a negative voltage across the switching coil 102 then causes the electrical current in the field coils 101 to reduce to zero.

Figure 3:
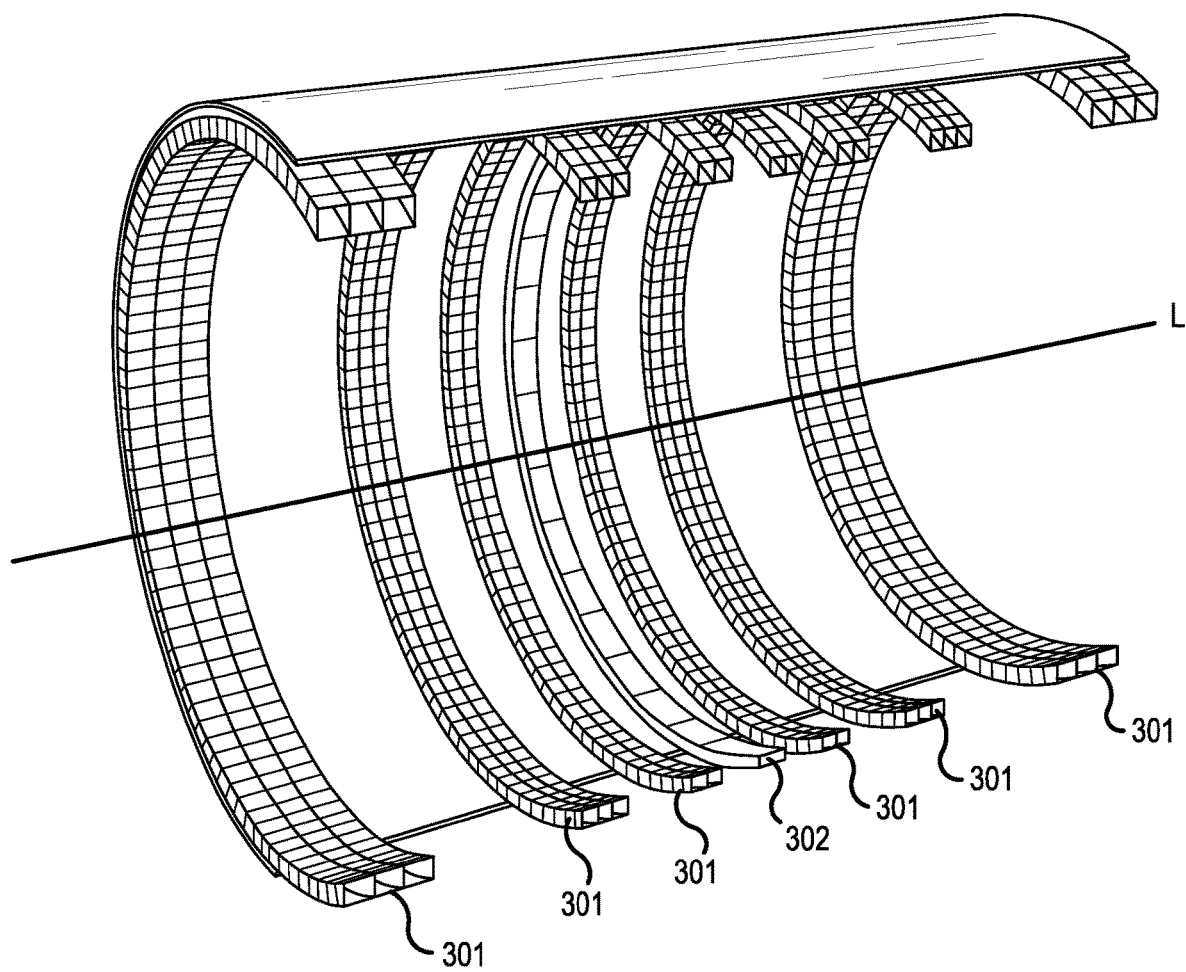
FIG. 3 is a perspective view of coils in an example of a superconducting magnet assembly according to an embodiment.

FIG. 3 is a perspective view of coils in an example of a superconducting magnet assembly according to an embodiment. Field coils 301 and switching coil 302 are geometrically aligned coaxially along a common longitudinal axis L while the windings of the field coils 301 as well as the switching coil 302 are azimuthally around the longitudinal axis L. The field coils 301 and the switching coil 302 may be in parallel radially (transversely to the longitudinal axis L) extending planes. Each of the field coils 301 and the switching coil 302 may have different or equal radial sizes and numbers of windings in accordance with the field strength and spatial distribution of the stationary magnetic field.

The invention claimed is:

1. A superconducting magnet arrangement comprising:
   a field coil assembly configured to generate a stationary magnetic field in an operational state, the field coil assembly including (i) coil windings that are electrically superconducting when the field coil assembly is in the operational state, and (ii) connection ports for voltage supply, wherein the coil windings are circuited between the connection ports; and
   a switching module configured to switch a switchable section of the coil windings between an electrical superconducting state and an electrical resistive state, wherein the switchable section of the coil windings forms a switching coil circuited between the connection ports and remaining sections of the coil windings form at least one field coil of the field coil assembly,
   wherein in the operational state the switching coil and the at least one field coil operate together to generate the stationary magnetic field.

2. The superconducting magnet arrangement of claim 1, wherein inductance of the switching coil is smaller than inductance of the at least one field coil.

3. The superconducting magnet arrangement of claim 2, wherein a ratio of the inductance of the switching coil to the inductance of the at least one field coil is in a range of 1/20 to 1/2.

4. The superconducting magnet arrangement of claim 3, wherein the ratio of the inductance of the switching coil to the inductance of the at least one field coil is in a range 0.08 to 0.12.

5. The superconducting magnet arrangement of claim 1 further comprising a support structure which carries the field coil assembly, wherein a thermal isolation is provided between the switching coil and the support structure.

6. The superconducting magnet arrangement of claim 1, wherein, when in the electrical superconducting state, the switching coil is circuited in series with the at least one field coil.

7. The superconducting magnet arrangement of claim 1, wherein the at least one field coil comprises multiple field coils arranged coaxially along a common longitudinal axis, coil windings of the multiple field coils and the switching coil are azimuthally around the common longitudinal axis.

8. The superconducting magnet arrangement of claim 1, wherein the at least one field coil and the switching coil include windings of a high-temperature superconducting material having a critical temperature in a range of 20-80K.

9. The superconducting magnet arrangement of claim 8, wherein the high-temperature superconducting material is $MgB_2$.

10. A magnetic resonance imaging system comprising the superconducting magnet arrangement as claimed in claim 1.

11. The superconducting magnet arrangement of claim 1, wherein the switching module comprises a heater configured to heat the switchable section of the coil windings to switch the switchable section of the coil windings from the electrical superconducting state to the electrical resistive state.

12. The superconducting magnet arrangement of claim 11, wherein the heater is configured to deactivate, allowing the switchable section of the coil windings to cool, to switch the switchable section of the coil windings from the electrical resistive state to the electrical superconducting state.

13. The superconducting magnet arrangement of claim 1, wherein in the operational state, electrical currents in the switching coil and the at least one field coil become equal.

14. A superconducting magnet arrangement comprising:
   a field coil assembly including (i) coil windings that are electrically superconducting when in operation and (ii) connection ports for voltage supply, wherein the coil windings are circuited between the connection ports; and
   a switching module configured to switch a switchable section of the coil windings between an electrical superconducting state and an electrical resistive state, wherein the switchable section of the coil windings forms a switching coil of the field coil assembly,
   wherein the switching coil includes a length of superconducting wire in a range of 1600-2400 m.

15. The superconducting magnet arrangement of claim 14, wherein the coil windings include a high-temperature superconducting material having a critical temperature in a range of 20-80K.

16. The superconducting magnet arrangement of claim 15, wherein the high-temperature superconducting material is $MgB_2$.

17. A method of ramping-up a field coil assembly of a superconducting magnet arrangement, the field coil assembly comprising a plurality of coil windings including a switching coil and at least one field coil, the method comprising:
   setting the switching coil to a resistive state and connecting a voltage supply to connection ports of the field coil assembly to increase an electrical current through the at least one field coil;
   when the electrical current through the at least one field coil has reached a pre-set end-value for the at least one field coil to be electrically superconducting, setting the switching coil to a superconductive state for the switching coil to be electrically superconducting; and
   switching-off the voltage supply,
   wherein, when electrically superconducting, the switching coil and the at least one field coil operate together to generate a stationary magnetic field.

18. The method of claim 17, wherein setting the switching coil to the resistive state comprises heating the switching coil.

19. The method of claim 17, wherein setting the switching coil to the resistive state comprises interrupting cooling of the switching coil.

20. The method of claim 17, wherein inductance of the switching coil is smaller than inductance of the at least one field coil.

* * * * *